US012677454B2

(12) United States Patent
Kondo et al.

(10) Patent No.: US 12,677,454 B2
(45) Date of Patent: Jul. 7, 2026

(54) SEMICONDUCTOR DEVICE

(71) Applicant: SANKEN ELECTRIC CO., LTD.,
Niiza (JP)

(72) Inventors: Taro Kondo, Niiza (JP); **Bungo
Tanaka, Niiza (JP); Jun Yasuhara**,
Niiza (JP)

(73) Assignee: SANKEN ELECTRIC CO., LTD.,
Niiza (JP)

( * ) Notice: Subject to any disclaimer, the term of this
patent is extended or adjusted under 35
U.S.C. 154(b) by 385 days.

(21) Appl. No.: 18/462,462

(22) Filed: Sep. 7, 2023

(65) Prior Publication Data

US 2024/0096957 A1 Mar. 21, 2024

(30) Foreign Application Priority Data

Sep. 16, 2022 (JP) ................................ 2022-148611

(51) Int. Cl.
H10D 62/10 (2025.01)
H10D 30/66 (2025.01)
H10D 64/00 (2025.01)

(52) U.S. Cl.
CPC ......... H10D 62/127 (2025.01); H10D 30/668
(2025.01); H10D 64/117 (2025.01)

(58) Field of Classification Search
CPC ... H10D 62/127; H10D 64/117; H10D 30/668
USPC ....................................................... 257/330
See application file for complete search history.

(56) References Cited

U.S. PATENT DOCUMENTS

| | | | |
|---|---|---|---|
| 5,929,482 A | 7/1999 | Kawakami et al. | |
| 2012/0061753 A1* | 3/2012 | Nishiwaki ............ | H10D 64/117 |
| | | | 257/E29.264 |

(Continued)

FOREIGN PATENT DOCUMENTS

| | | | | |
|---|---|---|---|---|
| CN | 112447847 A | * | 3/2021 | ........... H10D 64/519 |
| JP | H9-008301 A | | 1/1997 | |

(Continued)

OTHER PUBLICATIONS

English translation (Year: 2021).*

(Continued)

*Primary Examiner* — Igwe U Anya
(74) *Attorney, Agent, or Firm* — METROLEX IP LAW
GROUP, PLLC; Robert L. Scott, Esq.

(57) ABSTRACT

A semiconductor device according to one or more embodiments may include a first semiconductor region, a second semiconductor region arranged on the first semiconductor region, a third semiconductor region arranged on the second semiconductor region, a first trench penetrating the second semiconductor region from the third semiconductor region and reaching the first semiconductor region, a first main electrode arranged on the second semiconductor region via a first insulating film, field electrodes arranged via second insulating films in a second trenches that are deeper than the first trench and reach the first semiconductor region. The first main electrode may be arranged between the field electrodes. The field electrodes may be arranged alternately, and the field electrodes that are alternately adjacent to each other may be arranged so that the field electrodes partially overlap with adjacent field electrodes in an alignment direction of the arranging field electrodes in a plan view.

10 Claims, 6 Drawing Sheets

(56) References Cited

U.S. PATENT DOCUMENTS

| | | | |
|---|---|---|---|
| 2017/0170273 A1 | 6/2017 | Naito | |
| 2020/0243641 A1* | 7/2020 | Nakagawa | H10D 84/144 |
| 2020/0295179 A1 | 9/2020 | Kishi et al. | |
| 2021/0074848 A1* | 3/2021 | Katou | H10D 30/668 |
| 2021/0083103 A1* | 3/2021 | Katou | H10D 64/513 |
| 2022/0093727 A1 | 3/2022 | Kondo | |
| 2023/0088792 A1 | 3/2023 | Kondo et al. | |
| 2023/0097629 A1 | 3/2023 | Nakano | |
| 2024/0421199 A1* | 12/2024 | Nagata | H10D 30/60 |

FOREIGN PATENT DOCUMENTS

| | | | |
|---|---|---|---|
| JP | H11-135512 A | 5/1999 | |
| JP | 2012-209330 A | 10/2012 | |
| JP | 2017-112134 A | 6/2017 | |
| JP | 2021-040105 A | 3/2021 | |
| JP | 2022-051356 A | 3/2022 | |
| WO | 2017/122318 A1 | 7/2017 | |
| WO | 2021/155943 A1 | 8/2021 | |
| WO | 2021/261397 A1 | 12/2021 | |
| WO | 2023/176118 A1 | 9/2023 | |

OTHER PUBLICATIONS

An Office Action mailed on Dec. 9, 2025 in a counterpart Japanese patent application No. 2022-148611.
Decision to Grant a Patent ("Decision") mailed on Feb. 24, 2026 in a counterpart Japanese patent application 2022-148611.

* cited by examiner

SEMICONDUCTOR DEVICE

CROSS REFERENCE TO RELATED APPLICATIONS

This application claims priority to prior Japanese Patent Application No. 2022-148611 filed with the Japan Patent Office on Sep. 16, 2022, the entire contents of which are incorporated herein by reference.

BACKGROUND

The disclosure relates to a semiconductor device.

In the related arts, a semiconductor device is disclosed that includes a gate electrode pattern that is arranged to intersect in the top plan view to increase the channel area in order to improve the on-resistance, and field electrodes with dot-shaped to improve the breakdown voltage of semiconductor devices by sandwiching the gate electrode patterns between them. Also a semiconductor device is disclosed that includes a region of impurity concentration lower than that of the body region at the intersection of the gate electrode pattern sandwiched by the field electrodes. Furthermore, a semiconductor device is disclosed that includes a field electrode with a unique shape viewed from above to pinch off easily. The International Publication No. 2021/155943 (Patent literature 1) and the Japanese Laid-open Patent Publication No. 2021-40105 (Patent literature 2) are related arts.

SUMMARY

However, if a region of lower impurity concentration than the body region is formed at the intersection of gate electrode patterns, such as is disclosed in the Patent literature 1, the channel resistance increases and the on-resistance rises. In addition, field electrodes with complex shapes, such as is disclosed in Patent literature 2, result in large variations in characteristics due to manufacturing variations during field electrode formation.

A semiconductor device according to one or more embodiments may include: a first semiconductor region of a first conductivity type; a second semiconductor region of a second conductivity type that is arranged on the first semiconductor region, a third semiconductor region of the first conductivity type that is arranged on the second semiconductor region, a first trench that penetrates the second semiconductor region from the third semiconductor region and reaching the first semiconductor region; a first insulating film that is arranged inside of the first trench; a first main electrode that is arranged inside of the first trench in the second semiconductor region via the first insulating film; second trenches that reach deeper than the first trench and is arranged in the first semiconductor region; second insulating films that are arranged inside of the second trenches in the first semiconductor region; and field electrodes that are arranged inside of the second trenches in the first semiconductor region via the second insulating films. In one or more embodiments, the first main electrode may be arranged between the field electrodes. The field electrodes may be arranged alternately, and the field electrodes that are alternately adjacent to each other may be arranged so that the field electrodes partially overlap with adjacent field electrodes in an alignment direction of the arranging field electrodes as viewed from above.

DETAILED DESCRIPTION

A semiconductor device according to one or more embodiments is described with reference to the drawings. In the following description of the drawings, same or similar parts are marked with same or similar numerical reference. It should be noted, however, that the drawings are schematic, and the relationship between thickness and plan dimensions, as well as the ratio of lengths of each part, may not be limited the scope. Therefore, specific dimensions should be determined by referring to the following explanations. Also, the relationships and ratios of dimensions among drawings may differ from each other.

Embodiments shown below are examples of devices and methods for embodying the technical concept, and the technical concept does not specify the shape, structure, arrangement, etc. of the component parts to those shown below. Various changes may be made to an embodiment or embodiments within the technical scope. In the following descriptions when explaining the positional relationship of components, "top", "bottom", "right side", "left side", etc. may be used as necessary based on an orientation of the referenced drawing, but these indications do not limit the technical concept. "Top", "bottom", "right side", "left side", "on", etc. may be used without the parts physically touching each other.

(First Variation)

Figure 1:
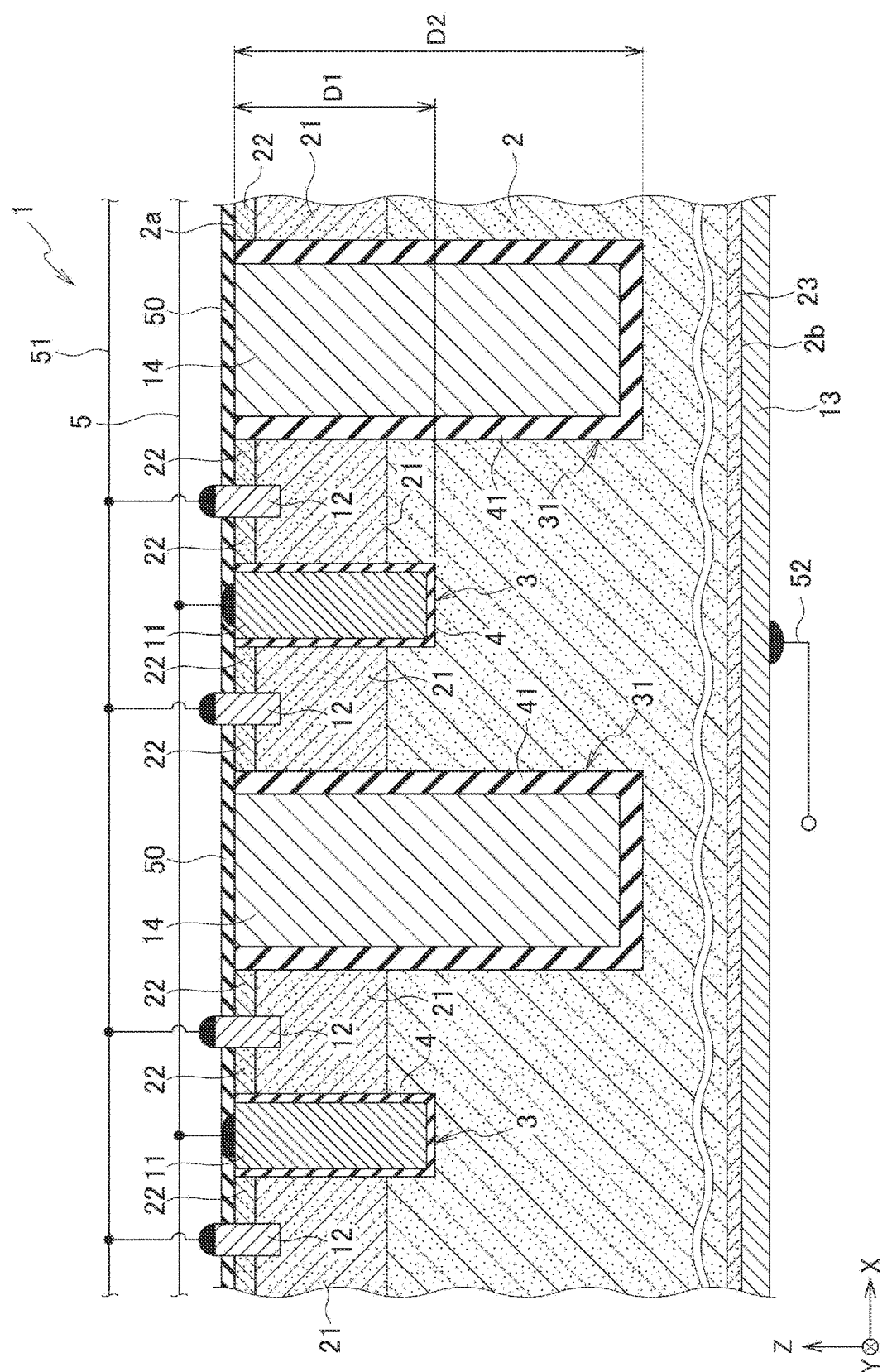
FIG. 1 is a diagram illustrating a schematic cross-sectional view of a structure of a semiconductor device according to a first variation.
Figure 2:
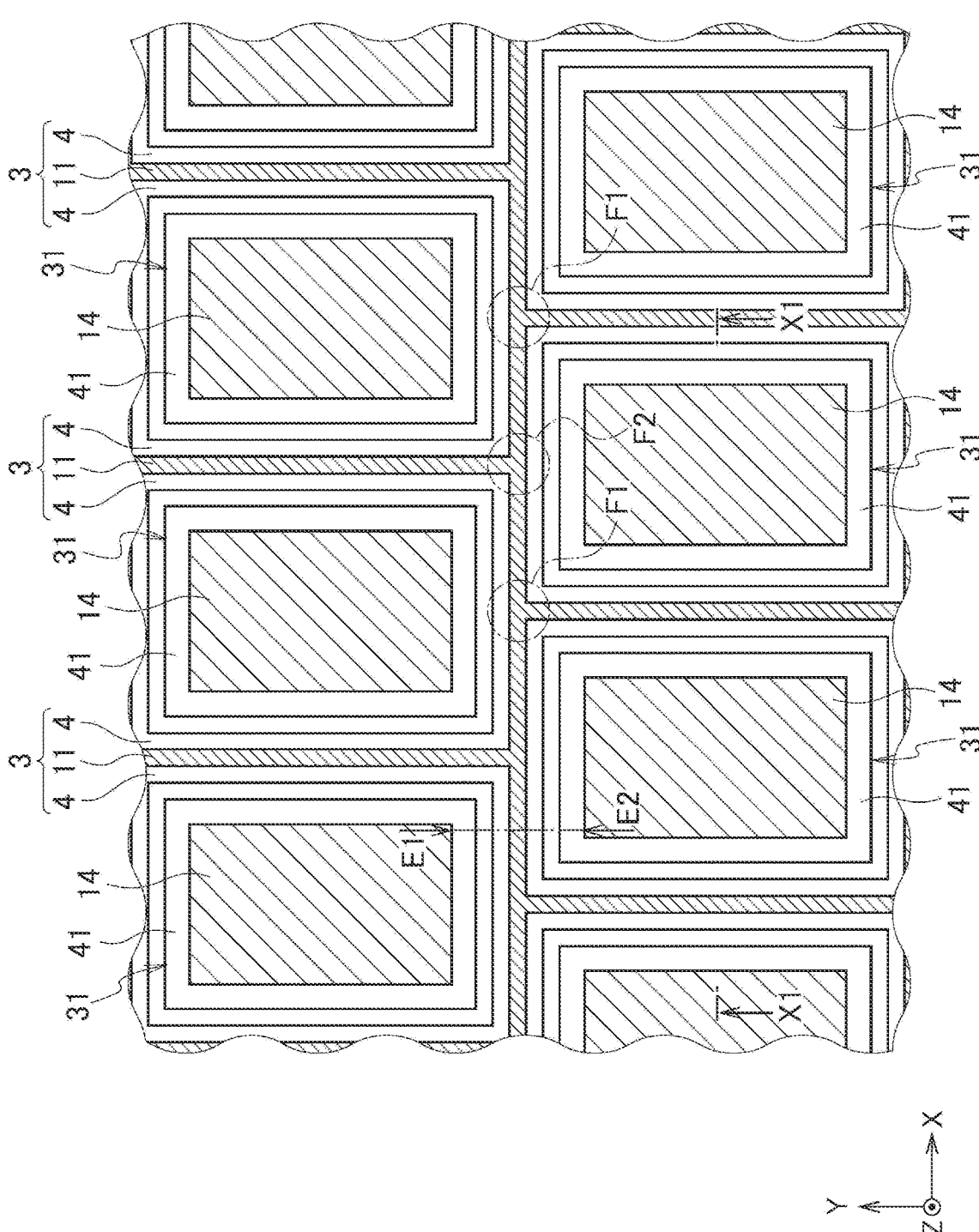
FIG. 2 is a diagram illustrating a plan view of a semiconductor device according to a first variation.

FIG. 1 is a diagram illustrating a schematic cross-sectional view of a semiconductor device 1 according to one or more embodiments. FIG. 2 is a diagram illustrating a plan view of a semiconductor device 1 such as is shown in FIG. 1. FIG. 1 is a cross-sectional view along the X1-X1 line of FIG. 2. In the following description, the XYZ coordinate system which is an example of a Cartesian coordinate system is used. That is, the plane parallel to the surface of the substrate of the semiconductor device 1 is the XY plane, and the direction orthogonal to the XY plane is the Z direction. The X and Y axes are two orthogonal directions in the XY plane.

As shown in FIG. 1, the semiconductor device 1 according to a first variation may include a drift region 2, which is an example of a first semiconductor region of the first conductivity type, a body region 21, which is an example of a second semiconductor region of the second conductivity type different from the first conductivity type, and a source region 22, which is an example of a third semiconductor region of the first conductivity type.

The semiconductor device 1 includes a gate electrode 11, which is an example of a first main electrode, arranged in the first trench 3, and a plurality of field electrodes 14 arranged in the second trenches 31. The semiconductor device 1 may include a drain region 23, which is an example of a fourth semiconductor region of the first conductivity type, a source electrode 12, which is an example of a second main electrode, a drain electrode 13, which is an example of a third main electrode, a gate insulating film 4, which is an example of a first insulating film, a field insulating film 41, which is an example of a second insulating film, a first conductor gate wiring 5, which is an example of the first conductor, the source wiring 51, which is an example of the second conductor, the drain wiring 52, which is an example of a third conductor, and the interlayer dielectric film 50.

The first and second conductive types may have opposite polarity each other. That is, when the first conductivity is n-type, the second conductivity is p-type, and when the first conductivity is p-type, the second conductivity is n-type. In the following, the case where the first conductivity type is n-type and the second conductivity type is p-type is explained.

The semiconductor device 1 includes a semiconductor substrate including a drift region 2, a body region 21, a source region 22, and a drain region 23.

The first principal surface 2a of the semiconductor substrate is the top surface in contact with the source region 22. The second principal surface 2b of the semiconductor substrate is the lower surface in contact with the drain region 23.

The drift region 2 is arranged between the body region 21 and the drain region 23.

The body region 21 is arranged on the drift region 2 on the first principal surface 2a side.

The source region 22 is arranged on the body region 21.

The first trench 3 penetrates the body region 21 from the source region 22 to reach the drift region 2.

The gate insulating film 4 is formed in the first trench 3.

The gate electrode 11 is arranged on the body region 21 via the gate insulating film 4 in the first trench 3.

The second trench 31 penetrates the body region 21 from the source region 22 to the drift region 2. The depth of the second trench 31 (position of the bottom of the second trench 31) D2 is deeper than the depth of the first trench 3 (position of the bottom of the first trench 3) D1.

The field insulating film 41 is formed inside of the second trench 31. The side walls of the field insulating film 41 formed in the second trench 31 have the essentially the same thickness and the same depth so that the second trench 31 and the field electrode 14 have essentially the same shape. The field insulating film 41 may, for example, have a thicker insulating film than the gate insulating film 4.

The field electrode 14 is arranged in the second trench 31 via the field insulating film 41.

The drain region 23 is arranged on the second principal surface 2b side on the drift region 2.

The source electrode 12 is arranged in electrical contact with the source region 22 and the body region 21. Specifically, the source electrode 12 may be arranged through the source region 22, for example, such as is shown in FIG. 1.

The drain electrode 13 is arranged on the drain region 23.

The gate wiring 5 is arranged on the first principal surface 2a side of the semiconductor substrate.

The source wiring 51 is arranged on the side of the first principal surface 2a the semiconductor substrate.

The drain wiring 52 is arranged on the side of the second principal surface 2b of the semiconductor substrate.

The interlayer dielectric film 50 is arranged to cover, for example, the source region 22, the gate electrode 11, and the field electrode 14.

As shown in FIG. 2, the gate electrode 11 is arranged between the field electrodes 14 in the top plan view.

The first trench 3 has T-like shaped portions F1 and F2 that are divided into two halves in the Y-direction before reaching the second trench 31 in the top plan view. Also, in the top plan view, the T-like shaped portion F1, and the T-like shaped portion F2 that is arranged opposite to the T-like shaped portion F1 are arranged at both ends of the second trench 31 in the Y direction. The T-like shaped portion F1 and T-like shaped portion F2 between adjacent second trenches 31 in the Y direction are connected in the X direction alternately.

The second trench 31 are arranged alternately in the top plan view. The field electrodes 14 are arranged alternately in the plan view. Specifically, as shown in FIG. 2, the field electrodes 14 are arranged in parallel in X direction and are staggered in Y direction, for example.

The alternately adjacent field electrodes 14 are arranged such that, in the top plan view, the field electrodes 14 are arranged partially overlap with the adjacent field electrodes in the field electrodes 14 alignment direction (in this case, the Y direction). Specifically, the extended line in the Y direction of an end E1 of the field electrode 14 (the edge in the X direction) is arranged so that, for example, a part of an end E2 overlaps (or matches) with the adjacent field electrode 14. In other words, in the Y direction, the field electrode 14 is arranged partially overlapping with the adjacent field electrode 14 via the gate electrode 11.

The field electrodes 14 have rectangular-like shaped structure in the top plan view.

As shown in FIG. 1, the gate electrode 11 is electrically connected to the gate wiring 5.

The source electrode 12 is electrically connected to the source region 22 and the body region 21. The source electrode 12 is electrically connected to the source wiring 51.

Drain electrode 13 is electrically connected to drain region 23. The drain electrode 13 is electrically connected to the drain wiring 52.

The field electrode 14 may be electrically connected to the source wiring 51, although not shown. In other words, the source region 22 and the field electrode may be electrically shorted between the source region 22 and the field electrode.

As described above, in the semiconductor device shown in FIG. 1 and FIG. 2, a trench MOS cell with a first trench between the field electrodes is arranged, viewed from above, and the field electrodes 14 are arranged alternately, and the alternately adjacent field electrodes 14 are arranged so that the field electrodes 14 partially overlap each other viewed from the direction of the field electrode 14 alignment. The field electrodes are arranged so that they overlap each other, which allows the depletion layer in the semiconductor region between the field electrodes 14 to be more extended and improves the breakdown voltage.

In the semiconductor device shown in FIGS. 1 and 2, a trench MOS cell with a first trench between the field electrodes 14 is arranged, viewed from above, and the field electrodes are arranged alternately, with the first trench 3 intersecting the second trench 31 in the Y direction just before it hits it, forming T-like shaped portions F1, and F2. Each of the field electrodes 14 are arranged alternately with the adjacent field electrode 14 opposite each other with respect to the intersection of the T-shaped portions F1 and F2 of the first trench 3. And, in order to make the distance between the first trench 3 and the second trench 31 as equal as possible when viewed from above, the side surface of the first trench 3 has a layout that is similar to that of the second trench 31. Furthermore, the field electrodes 14 adjacent to each other via the gate electrode 11 are arranged so that they partially overlap each other when viewed from the direction of the field electrode 14 alignment. This allows the depletion layer to spread more in the region between the field electrodes, thereby improving the breakdown voltage more.

In the semiconductor devices shown in FIGS. 1 and 2, the above arrangement of field electrodes allows for higher breakdown voltage and lower on-resistance because the breakdown voltage does not need to be improved by impurity concentration at the intersection of the first trench.

(Modification of the First Variation)

Figure 3:
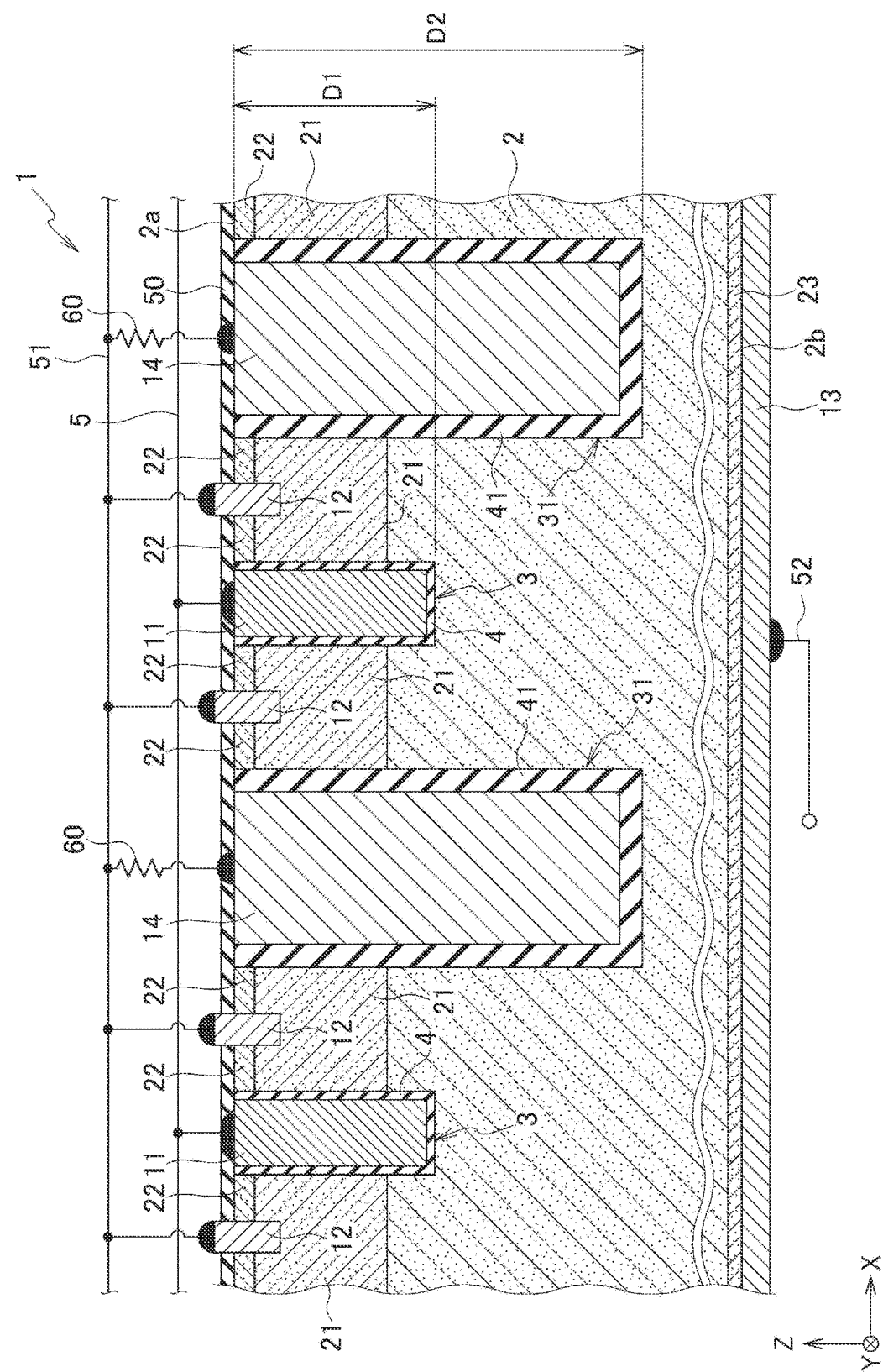
FIG. 3 is a diagram illustrating a schematic cross-sectional view of a semiconductor device according to a variant of a first variation.

As shown in FIG. 3, the semiconductor device 1 according to a modification of the first variation further includes a resistor 60 in contrast to the semiconductor device 1 according to the first variation. In other words, the modification includes the field electrode 14 electrically connected to the source wiring 51 through the resistor 60. Other configurations may be similar to or same as the first variation shown in FIG. 1.

The field electrode 14 is electrically connected to the source wiring 51 via the resistor 60. In other words, the source region 22 and the field electrode 14 are connected via the resistor 60.

According to the semiconductor device shown in FIG. 3, a surge voltage may be suppressed because soft recovery is achieved by introducing a resistor 60.

(Second Variation)

Figure 4:
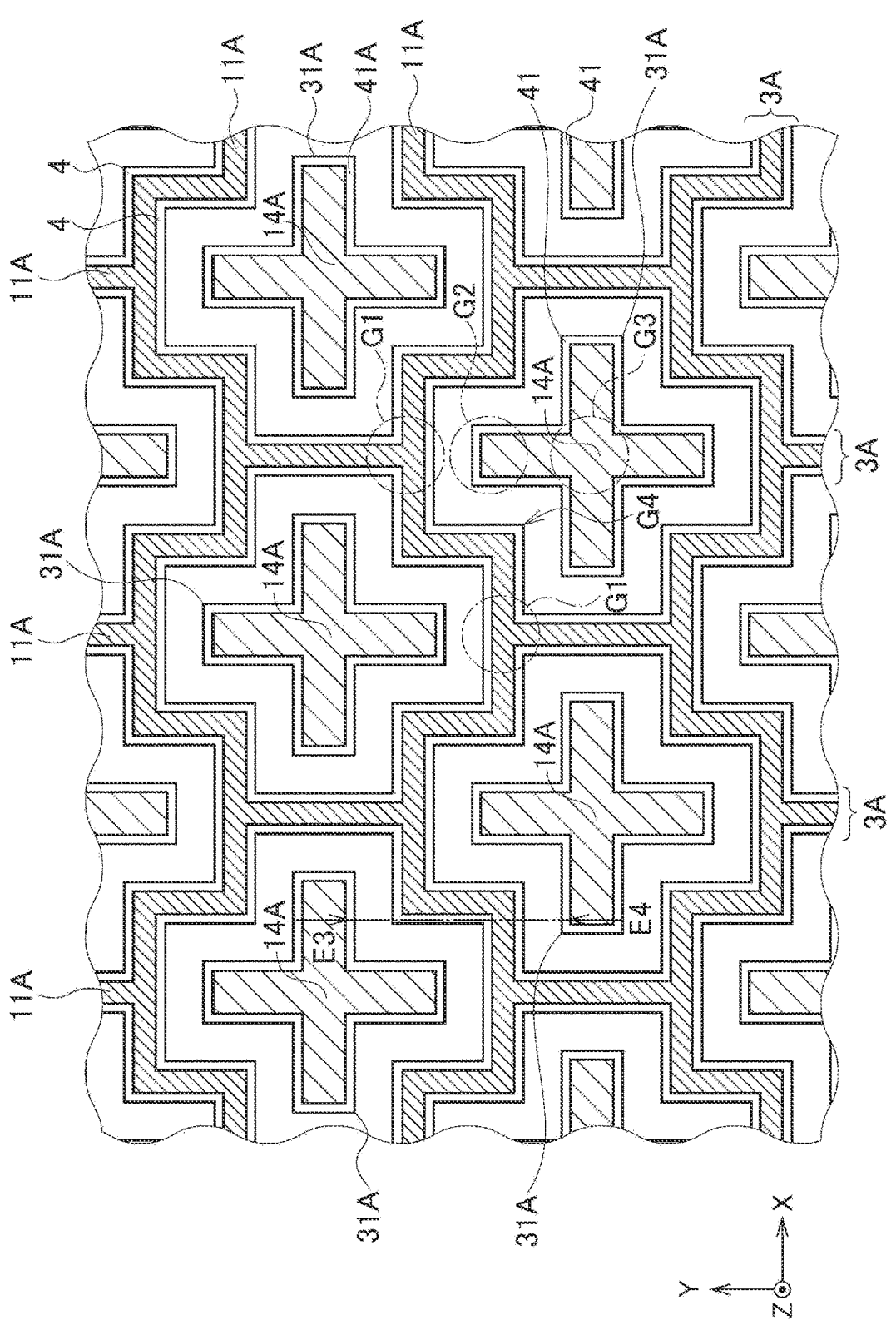
FIG. 4 is a diagram illustrating a plan view of a semiconductor device according to a second variation.

FIG. 4 is a diagram illustrating a plan view of the semiconductor device 1 according to a second variation.

As shown in FIG. 4, the field electrode 14A of the semiconductor device 1 according to the second variation has a cross-like shape portion, in the top plan view, whereas the field electrode 14 of the semiconductor device 1 of the first variation has a rectangular shape structure. The field insulating film 41 on the side surface of the second trench 31A has the essentially same thickness at the essentially same depth so that the second trench 31A has a cross-like shape structure in the top plan view. The layout of the first trench 3A and the gate electrode 11A may be different in the top plan view from the first variation shown in FIG. 2. Other configurations may be the same as or similar to the first variation shown in FIG. 1. In each of the second trenches 31A and field insulating films 41 in FIG. 4, the length extending in the X direction and the length extending in the Y direction from the intersection portion G3 may be the same. The length of either the length extending in the X direction or the length extending in the Y direction from the intersection portion G3 may be longer than that of the other.

The field electrodes 14A are arranged alternately in the top plan view. Specifically, as shown in FIG. 4, the field electrodes 14A are arranged alternately in the X and Y directions, for example.

In the top plan view, the adjacent field electrodes 14A are arranged alternately with and partially overlap with adjacent field electrodes in an alignment direction of the field electrodes 14 (in this case, the Y direction). Specifically, a point E3 of the field electrode 14A (in this case, the right side of an intersection portion of the field electrode 14A) is arranged to partially overlap with a part of an end E4 of the adjacent field electrode 14A (in this case, the left side of an intersection of the field electrode 14A, the widest portion in the X direction) in the Y direction. In other words, in the Y direction, the field electrode 14A partially overlaps with the adjacent field electrode 14A through the gate electrode 11A. The widest portion G2 in the Y direction of the field electrode 14A and T-like shaped portion G1 are arranged facing each other. The intersection portion G3 of the cross-like shaped portion of the field electrode 14A and the corner portion G4 of the first trench 3A extending in the X direction and then extending to the first trench 3A in the Y direction are arranged facing each other. In order to make the distance between the first trench 3A and the second trench 31A as equal as possible in the top plan view, the side surface of the first trench 3A has a similar layout to that of the second trench 31A. In FIG. 4, the adjacent field electrodes 14A are arranged so that they partially overlap each other as viewed from the Y direction, but the adjacent field electrodes 14A may be arranged so that they partially overlap each other not only in the Y direction but also in the X direction.

As explained above, in the semiconductor device shown in FIG. 4, a trench, such as a MOS cell with the first trench 3A between the field electrodes 14A is arranged and the field electrodes 14A are arranged alternately, and the alternately adjacent field electrodes 14A are arranged so that they partially overlap each other from the field electrode 14A in alignment direction. The field electrodes 14A are arranged so that they partially overlap each other, which allows the depletion layer to spread more in the area between the field electrodes 14A and improves the breakdown voltage.

(Third Variation)

Figure 5:
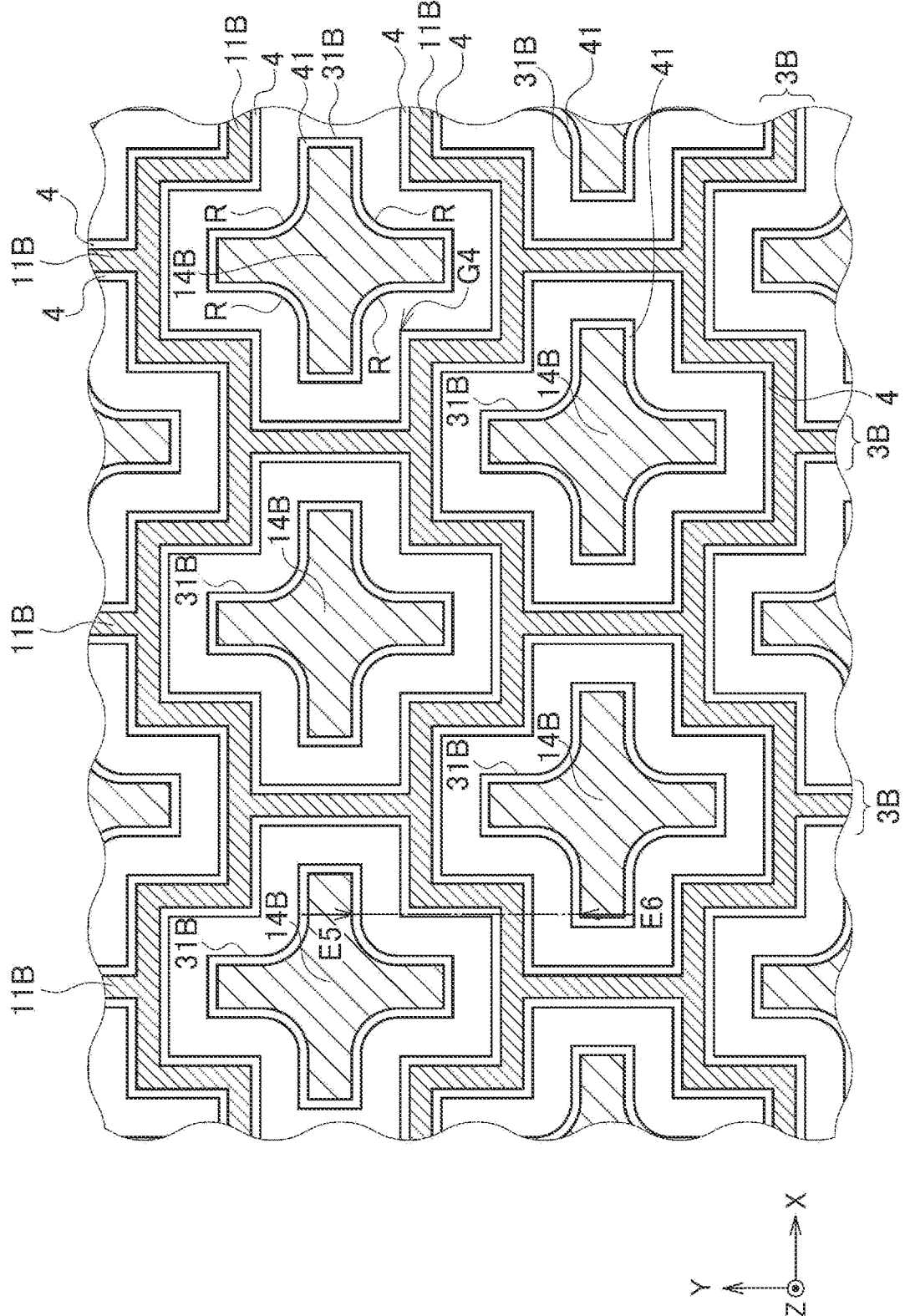
FIG. 5 is a diagram illustrating a plan view of a semiconductor device according to the third variation.

The second trench 31B and field electrode 14B of the semiconductor device 1 according to a third variation have a structure having portions R of curvature at the intersection of the cross-like shaped portions, as shown in FIG. 5, from above, relative to the second trench 31A and field electrode 14A of the semiconductor device 1 of the second variation. The other structure may be similar to or the same as the second variation shown in FIG. 4.

The field electrodes 14B are arranged alternately, in the top plan view. Specifically, as shown in FIG. 5, the field electrodes 14B are arranged alternately in the X and Y directions, for example.

In the top plan view, the alternatively adjacent field electrodes 14B are arranged to partially overlap with adjacent field electrodes in the field electrodes 14B alignment direction (in this case, the Y direction). Specifically, a point E5 of the field electrode 14B is arranged to partially overlaps with a sixth end E6 of the adjacent field electrode 14B (the point at which the field electrode 14B is widest in the X direction) in the Y direction. In other words, in the Y direction, the field electrode 14B partially overlaps with the adjacent field electrode 14B through the gate electrode 11B. In FIG. 5, the adjacent field electrodes 14B are arranged so that they partially overlap each other in the Y direction, but the adjacent field electrodes 14B may be arranged so that they partially overlap each other not only in the Y direction but also in the X direction.

The field electrode 14B has a structure with a portion R of curvature at the intersection of the cross-like shaped portions. The corner portion G4 of the first trench 3B extending in the X direction and the first trench 3B extending in the Y direction is arranged facing to the portion R of curvature of the field electrode 14B. Namely, the distance between the first trench 3B and the field electrode 14B may be shortened.

As explained above, in the semiconductor device shown in FIG. 5, by providing a trench such as a trench MOS cell having the first trench 3B between the field electrodes 14B and by arranging the second trench 31B and the field electrodes 14B alternately, in the top plan view, the T-like shaped portion where the first trench 3B crosses, the distance between the first trench 3B and the field electrode 14B becomes wider in the T-like shaped portion where the first trench 3B intersects the field electrode 14B, thereby improving the breakdown voltage.

In the semiconductor device shown in FIG. 5, the semiconductor device shown in FIG. 5 may improve the breakdown voltage by shortened the distance between the first trench 3B and the field electrode 14B due to the structure having curvature at the intersection of the second trench 31B and the cross section of the field electrode 14B.

As described above, a semiconductor device according to one or more embodiments may achieve a higher breakdown voltage the reduced on-resistance.

Other Embodiments

As described above, one or more embodiments have been described, but the discussion and drawings that form part of this disclosure should not be understood as limiting the scope. Various alternative embodiments, examples, and operational techniques will be apparent to those skilled in the art from this disclosure.

Thus, the scope will of course include various embodiments, etc., not described here. Thus, the technical scope is defined by the particulars of invention pertaining to the claims that are reasonable from the above description.

Figure 6:
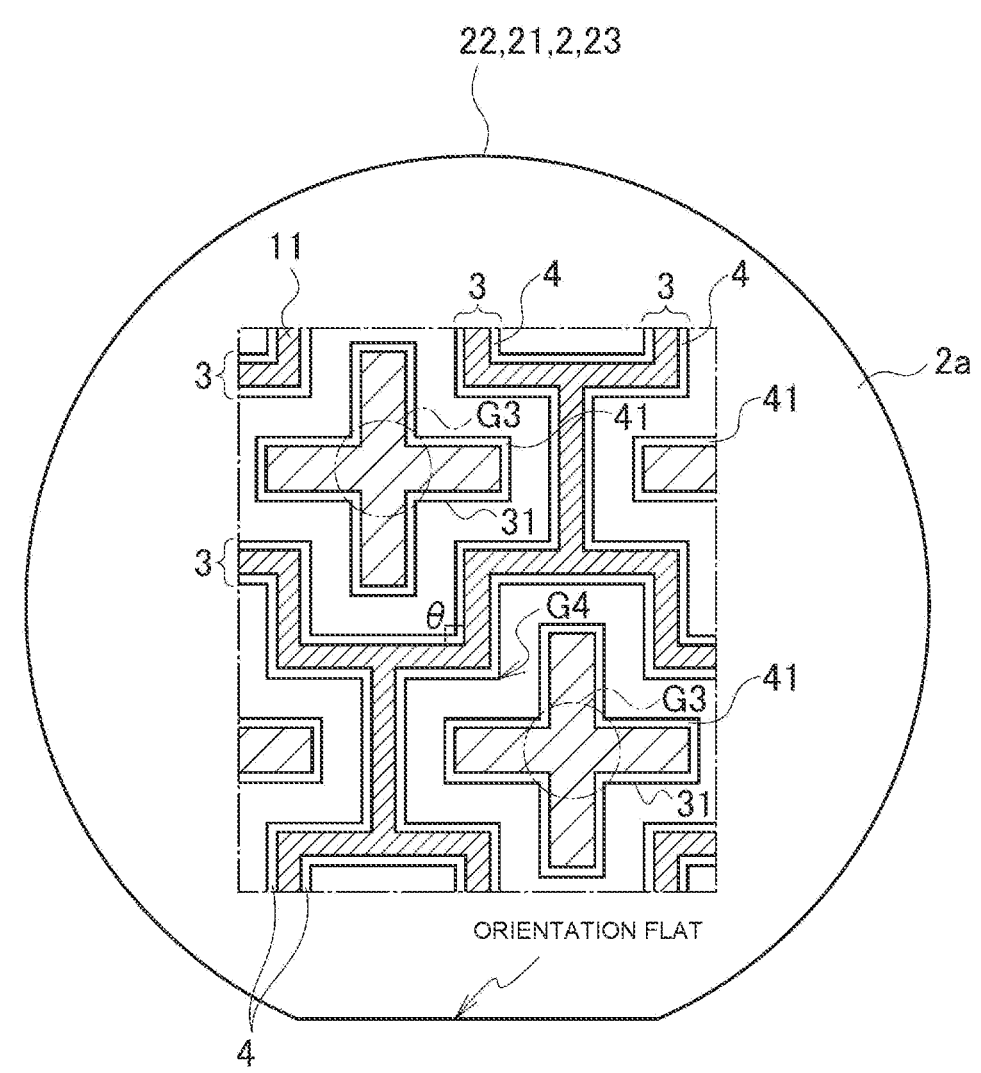
FIG. 6 is a diagram illustrating a plan view of a gate electrode arrangement relative to a substrate of the semiconductor device according to first to third variations.
Figure 6:
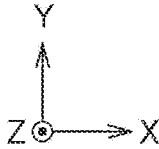

For example, as shown in FIG. 6, the first trenches 3, 3A, or 3B may extend in a 0° or 90° direction relative to the orientation flat plane of the semiconductor substrate, viewed from above. Specifically, the orientation flat plane of the semiconductor substrate may be, for example, a (100) plane.

By extending the first trenches 3, 3A, 3B in the 0° or 90° direction with respect to the Orientation flat plane, the increase in on-resistance of the channel mobility due to the plane orientation can be suppressed. Also, by extending and arranging the first trenches 3, 3A, 3B in the 0° or 90° direction relative to the orientation plane, the difference in etching speed and the difference in film thickness of the gate insulating film 4 due to the plane orientation of the semiconductor substrate can be made uniform. In other words, by extending the first trench 3 in the 0° or 90° direction relative to the orientation plane, the channel mobility and the gate insulating film 4 plane-orientation dependence can be suppressed. In addition, extending and arranging the second trenches 31, 31A, and 31B in the 0° or 90° direction relative to the orientation flat surface can make the thickness of the field insulating film 41 more uniform.

The invention claimed is:

1. A semiconductor device comprising:
a first semiconductor region of a first conductivity type;
a second semiconductor region of a second conductivity type that is arranged on the first semiconductor region,
a third semiconductor region of the first conductivity type that is arranged on the second semiconductor region,
a first trench that penetrates the second semiconductor region from the third semiconductor region and reaching the first semiconductor region;
a first insulating film that is arranged inside of the first trench;
a first main electrode that is arranged inside of the first trench in the second semiconductor region via the first insulating film;
second trenches that reach deeper than the first trench and is arranged in the first semiconductor region;
second insulating films that are arranged inside of the second trenches in the first semiconductor region; and field electrodes that are arranged inside of the second trenches in the first semiconductor region via the second insulating films, wherein
the first main electrode is arranged between the field electrodes, the field electrodes are arranged alternately, and the field electrodes that are alternately adjacent to each other are arranged so that the field electrodes partially overlap with adjacent field electrodes in an alignment direction of arranging the field electrodes in a plan view.

2. The semiconductor device according to claim 1, wherein
the first trench comprises a T-like shaped portion, an intersection of the T-like shaped portion arranges alternatively, and the intersection of the T-like shaped portion faces to the adjacent field electrodes in a plan view.

3. The semiconductor device according to claim 2, wherein
the second trenches and the field electrodes comprise cross-like shaped portions each comprising an intersection in a plan view.

4. The semiconductor device according to claim 3, wherein
the second trenches and the field electrodes have a curved portion at the intersection of the cross-like shaped portion in a plan view.

5. The semiconductor device according to claim 1, wherein
the second trenches and the field electrodes comprise cross-like shaped portions each comprising an intersection in a plan view.

6. The semiconductor device according to claim 5, wherein
the second trenches and the field electrodes have a curved portion at the intersection of the cross-like shaped portion in a plan view.

7. The semiconductor device according to claim 5, wherein
the first trench extends in a 0-degree or 90-degree direction relative to an orientation flat plane of a substrate of the semiconductor device in a plan view, and
a corner portion connecting the portion extending in the 0-degree direction with the portion extending in the 90-degree direction faces the intersection of the cross-like shaped portion of the second trench.

8. The semiconductor device according to claim 1, wherein
the third semiconductor region and the field electrodes are electrically shorted.

9. The semiconductor device according to claim 1, wherein said
the third semiconductor region and the field electrodes are electrically connected via a resistor.

10. A semiconductor device comprising:
a first semiconductor region of a first conductivity type;
a second semiconductor region of a second conductivity type that is arranged on the first semiconductor region,
a third semiconductor region of the first conductivity type that is arranged on the second semiconductor region,
a first trench that penetrates the second semiconductor region from the third semiconductor region and reaching the first semiconductor region;
a first insulating film that is arranged inside of the first trench;

a first main electrode that is arranged inside of the first trench in the second semiconductor region via the first insulating film;

second trenches that reach deeper than the first trench and is arranged in the first semiconductor region;

second insulating films that are arranged inside of the second trenches in the first semiconductor region; and field electrodes that are arranged inside of the second trenches in the first semiconductor region via the second insulating films, wherein the first main electrode is arranged between the field electrodes, the field electrodes are arranged alternately, and the field electrodes that are alternately adjacent to each other are arranged so that the field electrodes partially overlap with adjacent field electrodes in an alignment direction of arranging the field electrodes in a plan view, the second trenches and the field electrodes comprise cross-like shaped portions each comprising an intersection in a plan view, and the first trench comprises corner portions arranged so as to face the cross-like shaped portions.

* * * * *